United States Patent [19]

Graube

[11] Patent Number: 4,739,276
[45] Date of Patent: Apr. 19, 1988

[54] METHOD AND APPARATUS FOR DIGITAL TIME DOMAIN REFLECTOMETRY

[76] Inventor: Maris Graube, Rte. 1, Box 244H, Forest Grove, Oreg. 97116

[21] Appl. No.: 873,348

[22] Filed: Jun. 12, 1986

[51] Int. Cl.⁴ .............................................. G01R 31/11
[52] U.S. Cl. .................................... 324/534; 324/58 B
[58] Field of Search .......... 324/532, 534, 535, 58.5 B, 324/58 B, 533

[56] References Cited

U.S. PATENT DOCUMENTS

| | | | |
|---|---|---|---|
| 3,434,049 | 3/1969 | Frye | 324/533 |
| 3,617,880 | 11/1971 | Cormack et al. | 324/57 PS |
| 3,727,128 | 4/1973 | McFarrin | 324/533 |
| 3,812,423 | 5/1974 | Cronson et al. | 324/58.5 A |
| 3,903,477 | 9/1975 | Cronson et al. | 324/58.5 A |
| 3,911,358 | 10/1975 | Shalyte et al. | 324/532 X |
| 4,104,582 | 8/1978 | Lambertsen | 324/533 |
| 4,109,117 | 8/1978 | Wrench, Jr. et al. | 370/77 |
| 4,165,482 | 8/1979 | Gale | 324/523 |
| 4,208,627 | 6/1980 | Ebert, Jr. | 324/535 X |
| 4,475,079 | 10/1984 | Gale | 324/58 B X |
| 4,597,183 | 7/1986 | Broding | 324/206 X |

OTHER PUBLICATIONS

Tektronix Metallic Cable Testers: Accurate Time Domain Reflectometry For Field Maintenance, Long-Range and Short-Range.

Primary Examiner—Reinhard J. Eisenzopf
Assistant Examiner—Robert W. Mueller
Attorney, Agent, or Firm—Chernoff, Vilhauer, McClung & Stenzel

[57] ABSTRACT

A digital time domain reflectometer includes a pulse generator for generating a test pulse to a cable under test and comparator circuits for determining whether a reflected voltage pulse exceeds user-selected bias values thus indicating an impedance mismatch. Signal processing means which may include a computer and associated logic circuits set the bias values, trigger the pulse generator and record the time at which the reflected voltage pulse was observed. The digital time domain reflectometer may operate in a search mode in which it examines the entire cable for faults of increasingly less severity or may be used to determine the impedance signature of a cable by examining all impedance faults along its entire length.

3 Claims, 6 Drawing Sheets

METHOD AND APPARATUS FOR DIGITAL TIME DOMAIN REFLECTOMETRY

BACKGROUND OF THE INVENTION

The following invention relates to a method and apparatus for digital time domain reflectometry and in particular to a method and apparatus for obtaining an impedance signature of a cable under test.

The use of time domain reflectometers is a well-known method of establishing the location of faults and discontinuities in electrical cable. Such time domain reflectometers typically comprise a current pulse generator connected to the cable under test and an oscilloscope also connected to the cable to observe the shape of a voltage pulse caused by reflection at an impedance mismatch or discontinuity. Examples of these systems are shown in the Frye U.S. Pat. No. 3,434,049, Wrench, et al. U.S. Pat. No. 4,109,117, McFairen U.S. Pat. No. 3,727,128, Gayle U.S. Pat. No. 4,165,482, Lambertson U.S. Pat. No. 4,104,582, Cormack U.S. Pat. No. 3,617,880, Cronson U.S. Pat. No. 3,903,477 and Cronson U.S. Pat. No. 3,812,423. There are also commercially available time domain reflectometers such as those made by Tektronix, Inc. of Beaverton, Oreg. which are sold under Model Nos. 1502 and 1503.

The problem with all of the aforementioned devices is that the reflected voltage pulse is observed only as a trace on an oscilloscope, and a judgment must be made regarding the severity of the potential problem that the reflection represents. This requires a skilled operator who can interpret the data. For example, there may be many such reflections which represent minor cable impedance mismatches which may not be serious enough to warrant repair. Thus, such devices require skilled operators to observe and interpret traces on a CRT in order to determine the magnitude or character of the potential problems that the traces represent.

Unless a cable is perfect it will have minor impedance mismatches at various points along its length. It would be helpful in such cases to obtain an impedance "signature" for the cable that would tell a user where the impedance mismatches were located, and quantify them as to type and severity. Largely for the reasons stated above, conventional time domain reflectometers employing an oscilloscope are incapable of obtaining this data.

Yet a further problem is that most time domain reflectometers cannot be used in a network which includes a plurality of devices operatively in communication with one another. For example, most time domain reflectometers could not be used in a network which included a central computer and a number of satellite terminals connected over a network such as an IEEE 802.3 standard network. This severely limits the use of the time domain reflectometers described above to those situations in which the network can be disconnected and a test signal inserted. This is both time-consuming and cumbersome.

SUMMARY OF THE INVENTION

The present invention provides a method and apparatus which solves the above-mentioned problems encountered with previous time domain reflectometers, providing an inexpensive and accurate means for measuring the impedance signature of a network or connecting cable. The invention includes a signal processor such as a computer interfaced with control logic for providing test impulses to the cable under test and for storing and analyzing the results, as well as running test routines to determine the presence or absence of specific types of faults, or to obtain a cable's impedance signature.

The circuitry comprising the time domain reflectometer of the invention may be housed within a central computer which is connected to a cable under test. Other peripheral devices may be connected at other points along the cable under test. The apparatus comprises signal processing means, including the computer, and control logic which controls a pulse generator for generating a test pulse to the cable under test, and a voltage comparator for comparing a reflected voltage pulse with predetermined bias voltages. A reflected voltage pulse indicates impedance mismatches and discontinuities which may occur at various points along the cable under test. The reflected voltage pulse is compared with user-determined bias values which are established in the voltage comparator. If the reflected voltage pulse exceeds the amplitude of either the high or low bias values, which are set as voltages in high and low comparator circuits, a signal indicating that a discontinuity has been detected, is provided to the control logic. The control logic also controls a clock which may comprise a counter and a register for determining the time elapsed between the transmission of the test pulse and the generation of the detection signal in the voltage comparator. Thus, the user determines, by setting the high and low bias voltages in the comparator, the magnitude of the discontinuity or impedance mismatch that is sought.

In another mode of operation, the computer may automatically control the magnitude of the high and low bias voltages and search for impedance mismatches of increasingly less severity. For example, if no reflected pulse is sensed by the voltage comparator at arbitrary bias levels, the computer may cause a bias generator to lower the bias voltages in the comparator so that they are closer to the standard signal level for the type of cable under test. With these reduced bias voltages set, another test pulse is transmitted and any reflected voltage pulses are once again examined in the voltage comparator. If no reflected voltage pulse exceeds the upper or lower values of the bias voltages, the bias voltages are reduced again and yet another test pulse may be transmitted. This process may continue until the user is satisfied that there are no impedance mismatches of sufficient significance.

During this mode of operation, each time the test pulse generator is triggered, a counter is also initiated. When a reflected pulse is received by the voltage comparator which exceeds either the high or low value of the bias voltages, a detection signal is sent to the control logic which stops the counter, causes the counter value to be provided to the computer, and notes whether the reflected pulse exceeded either the high or the low bias voltage. An algorithm determines the location of the fault by multiplying the propagation velocity of the generated pulse by the elapsed time, which is represented by the value of the counter. A digital display available at the computer to which the reflectometer is connected may then indicate the type of fault and its location along the cable.

In yet another mode of operation, a cable signature may be obtained by storing the counter value each time a reflected pulse is detected at predetermined bias limits, and by enabling the voltage comparator after generating the next test pulse only after the last counter value has been exceeded. This will ensure that the data obtained on successive test pulses will indicate faults located forward of the last detected impedance mismatch or discontinuity.

In order that the digital time domain reflectomer of the present invention may operate on a network which may include a computer and other operative peripheral devices such as computer terminals, circuitry is provided for sensing the presence or absence of other data on the network cable, and for interrupting the operation of a test routine when such data is present. This is accomplished through the use of a carrier detect circuit, which monitors signals on the cable under test, and generates a signal which may be combined with a triggering signal from the computer in an AND gate when no other signals are on the cable under test, thus indicating its availability for testing. Moreover, spurious signals may be eliminated by a sampling routine that checks all readings for consistency of type and time of occurrence before storing these as data.

It is a principal object of this invention to provide a digital time domain reflectometer for automatically acquiring and interpreting time domain reflectometry data according to impedance parameters chosen by the user.

Yet a further object of this invention is to provide a digital time domain reflectometer capable of obtaining an impedance signature of a cable under test.

Yet a further object of this invention is to provide a digital time domain reflectometer which may be utilized in a network without the need for disconnecting other devices which may be linked to the network.

A still further object of this invention is to provide a digital time domain reflectometer capable of automatically searching for impedance mismatches or discontinuities within a range of user chosen impedance parameters.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
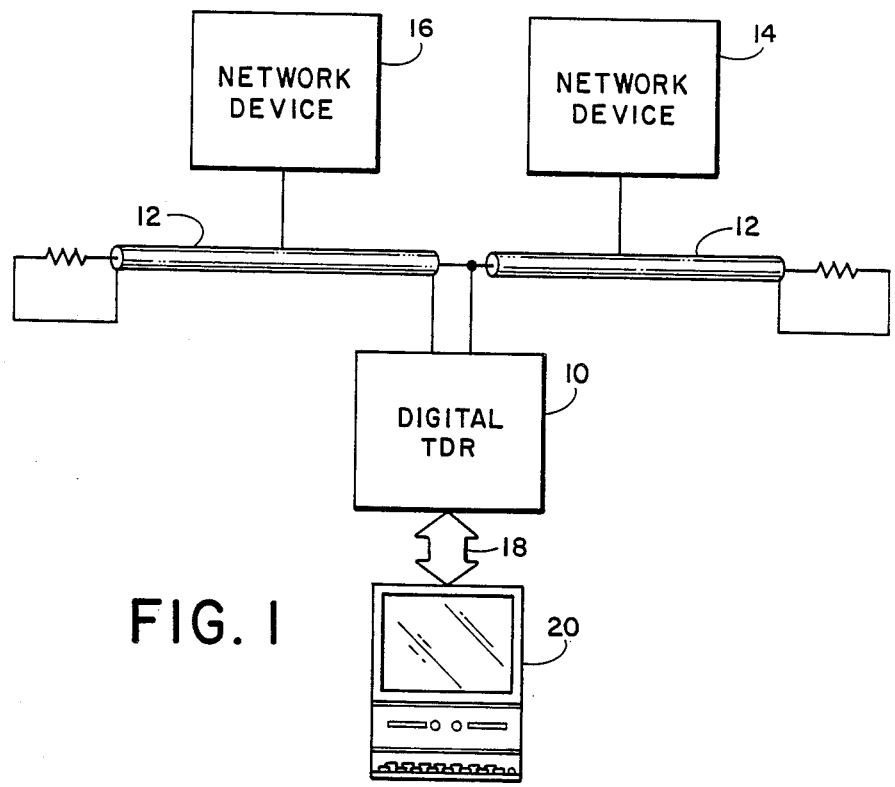
FIG. 1 is a block schematic diagram of a digital time domain reflectometer included as a component of a network which includes a cable to be tested.

A digital time domain reflectometer (DTDR) 10 is connected to a cable under test 12 which may include network devices 14 and 16. The DTDR 10 may be connected by a bus 18 to a computer 20. It should be noted that although the DTDR 10 is connected between the computer 20 and the cable 12, the computer 20 remains in communication with network devices 14 and 16. The DTDR 10, rather than being physcially interposed between the computer 20 and the cable 12, may be included as a subcomponent of the computer 20.

Figure 2:
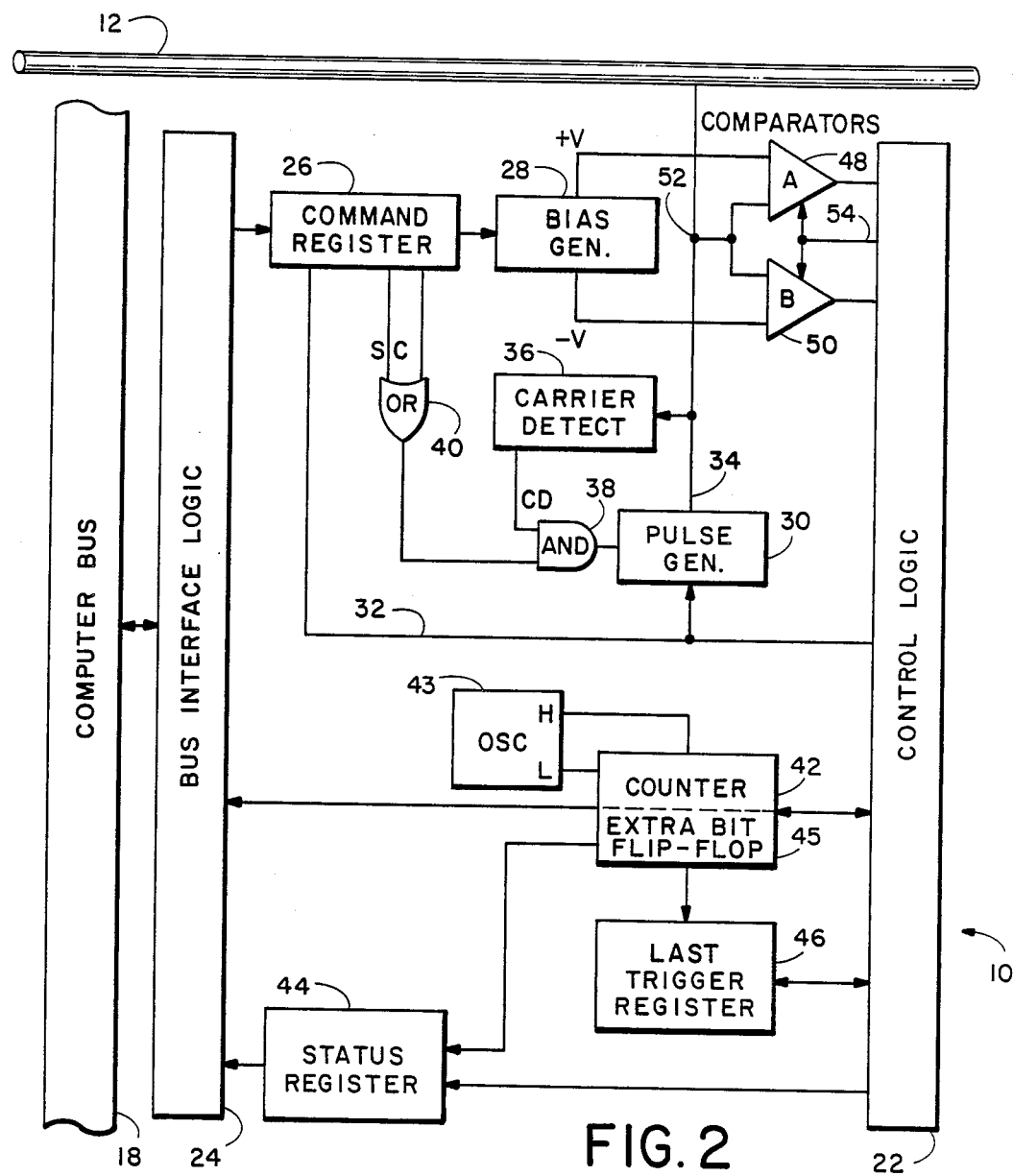
FIG. 2 is a block schematic diagram of the digital time domain reflectometer shown in FIG. 1.

Referring to FIG. 2, DTDR 10 includes control logic 22 which may comprise any suitable central processing unit which may be programmed to execute the signal processing and control steps to be described herein, or may comprise hard wired or dedicated logic circuitry.

A bus interface logic circuit 24 connects the DTDR 10 to the computer bus 18. The computer 20 communicates with the DTDR 10 by way of a command register 26 which is connected to a bias generator 28, a pulse generator 30 and the control logic 22 by means of line 32. The pulse generator 30 is connected to the cable under test 12 by means of line 34. Also connected to line 34 is a carrier detection circuit 36 which has an output connected to an AND gate 38. Connected to the other side of AND gate 38 is OR gate 40 which is driven by outputs from the command register 26. The control logic 22 controls a counter 42 driven by an oscillator 43 which is in communication with the computer 20 through bus interface logic 24. The counter output which includes extra bit flip-flop 45 is also connected to a status register 44 and a last trigger register 46.

Connected to a tap 52 on line 34 are comparators 48 and 50. The tap 52 connects one side of comparators 48 and 50 to line 34 while the other sides of comparators 48 and 50, respectively, are connected to +V and −V outputs from bias generator 28. Comparators 48 and 50 are controlled by a comparator enable line 54 from control logic 22.

Figure 3:
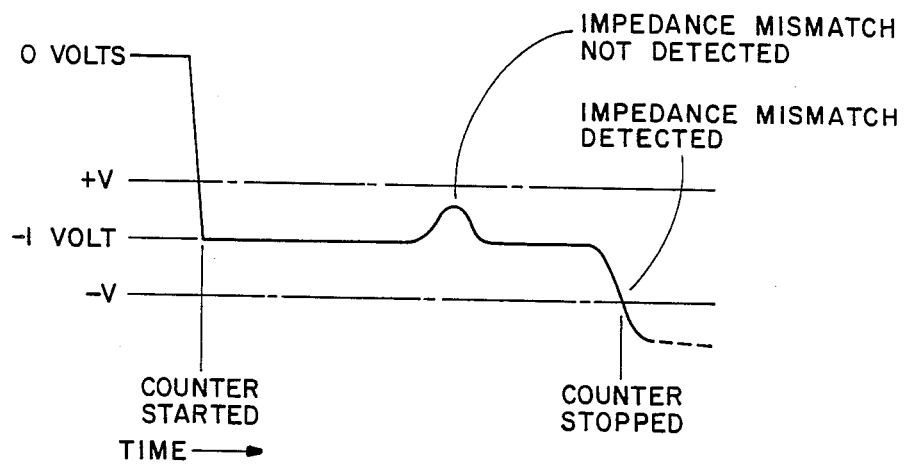
FIG. 3 is a waveform diagram illustrating the operation of the comparator circuitry of FIG. 2.

The method of pulse detection by the DTDR of FIG. 2 is shown by the waveform diagram in FIG. 3. The computer 20 controls the operation of the DTDR 10 by writing information into the command register 26. The measurement data is obtained by the computer 20 by reading the counter 42 and the status register 44. To initialize the DTDR 10, the computer 20 writes into the command register 26 the desired value of bias voltages +V and −V which are to be generated by the bias generator 28. It also sets the output lines to OR gate 40 which comprise "start" and "continue" logic bits which are transmitted to OR gate 40 over the lines labeled "S" and "C", respectively. A carrier detect circuit 36 monitors the signals on the cable under test 12 and generates a signal at the output labeled "CD" when there are no other signals present on the cable under test 12. When the computer 20 wishes to take a measurement on the cable under test 12 it writes a "1" into either the "start" or "continue" bit at the output of command register 26.

This causes the output of OR gate 40 to go high, and if output "CD" of the carrier detect circuit 36 is also high, the output of AND gate 38 will be high, thereby triggering pulse generator 30.

Pulse generator 30 places a current pulse onto cable under test 12 via line 34. The magnitude of the pulse is such that the resulting voltage on cable under test 12 is sufficiently large to indicate to any other device such as network devices 14 or 16 that a test transmission is occurring. For example, with an IEEE 802.3 standard type network the voltage resulting from the current pulse from pulse generator 30 will be on the order of $-1$ volt.

Simultaneously with the generation of the test pulse from pulse generator 30, the comparators 48 and 50 are enabled by the control logic 22 via enable line 54. Comparators 48 and 50 are high-speed ECL circuit types that are available in an integrated circuit, an example of which is a Motorola MC-1650.

In accordance with the normal operation of time domain reflectometers, the pulse from pulse generator 30 may be reflected at an impedance mismatch or discontinuity in the cable under test 12 back to the DTDR 10. At this time the reflected waveform is monitored by the comparators 48 and 50 as shown in FIG. 3. If the amplitude of the reflected voltage pulse exceeds neither the $+V$ or $-V$ bias voltages in comparators 48 and 50, respectively, the impedance mismatch is not detected. If, however, the voltage exceeds either the $+V$ or $-V$ voltage, an impedance mismatch is detected, and the counter 42 is stopped at this point in time. Also, if the counter 42 exceeds a predetermined maximum count without the detection of an impedance mismatch, the counter is stopped by control logic 22. At this point the computer 20 reads the status register 44 which includes a logic bit which indicates whether comparator 48 or 50 was triggered, and also reads counter 42 to determine the time that had elapsed between the generation of the test pulse by pulse generator 30 and the stopping of the counter 42 by control logic 22. The computer 20 may then compute, by a simple algorithm, the location along the cable under test 12 of the detected impedance mismatch. If the $+V$ bias threshold in comparator 48 is triggered, this indicates that the cable has shorted or that there is an impedance discontinuity that lowers the cable impedance. If, on the other hand, the $-V$ threshold is exceeded this indicates that the cable under test 12 is broken (open circuit condition), or that there is an impedance discontinuity that raises the cable impedance.

Figure 7:
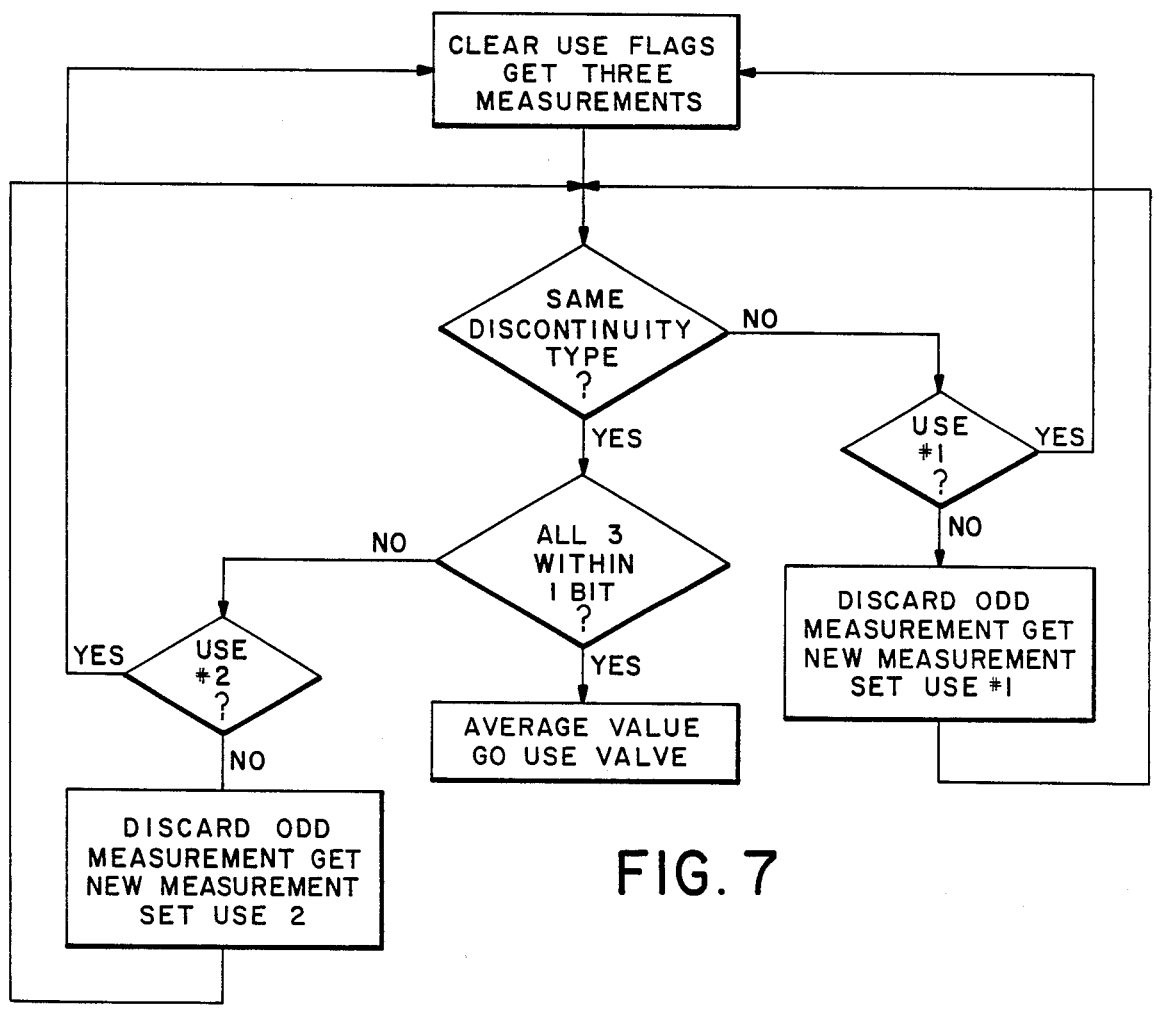
FIG. 7 is a flow chart diagram illustrating a method of operating the digital time domain reflectometer of FIG. 2 so as to eliminate ambiguities in data measurement when other devices are connected to the cable under test.

The DTDR 10 is designed to be used in a system which may include other network devices such as devices 14 or 16 operatively connected to the cable 12. The computer 20 may therefore perform a statistical analysis on readings obtained from the generation of test pulses as described above, in order to determine which readings are the result of impedance mismatches along the cable 12, and which represent signals from network devices 14 and 16. One such method of statistically analyzing this data is shown in the flow chart diagram of FIG. 7. First, the computer 20 obtains three status and counter measurements. If all three measurements indicate the same type of discontinuity, the computer 20 next determines whether the three counter values are within one bit of each other. If they are, the counter values are averaged and the computer assumes that this value represents an imedance mismatch. However, if one of the three measurements indicates a different type of discontinuity, the computer determines whether it had previously statistically examined this set of measurements. If the answer is yes, the three measurements are discarded and the process is re-started. If the answer is "no" the odd measurement is discarded and a new measurement is taken. At this point the computer notes that the foregoing procedure has been used once. It then analyzes the three current measurements to see whether they exhibit the same type of discontinuity. This loop will be repeated until all three measurements do indicate the same type of discontinuity, thus significantly reducing the possibility of erroneously reading a data transmission from one of the devices 14 or 16. Assuming, however, that all three measurements do indicate the same type of discontinuity, and that the three counter values are not within one bit of each other, the computer 20 first determines if the three measurements have been statistically examined once before for counter value. If yes, the loop is repeated. If the answer is no, the odd value is discarded and a new measurement is obtained. The computer then notes that this procedure has been used once and statistically determines whether the three values exhibit the same type of discontinuity. In summary, therefore, the computer 10 will not use a counter value and status register value unless three measurements have been taken and all three exhibit the same type of discontinuity, and the counter values are all within one bit of each other.

Figure 4:
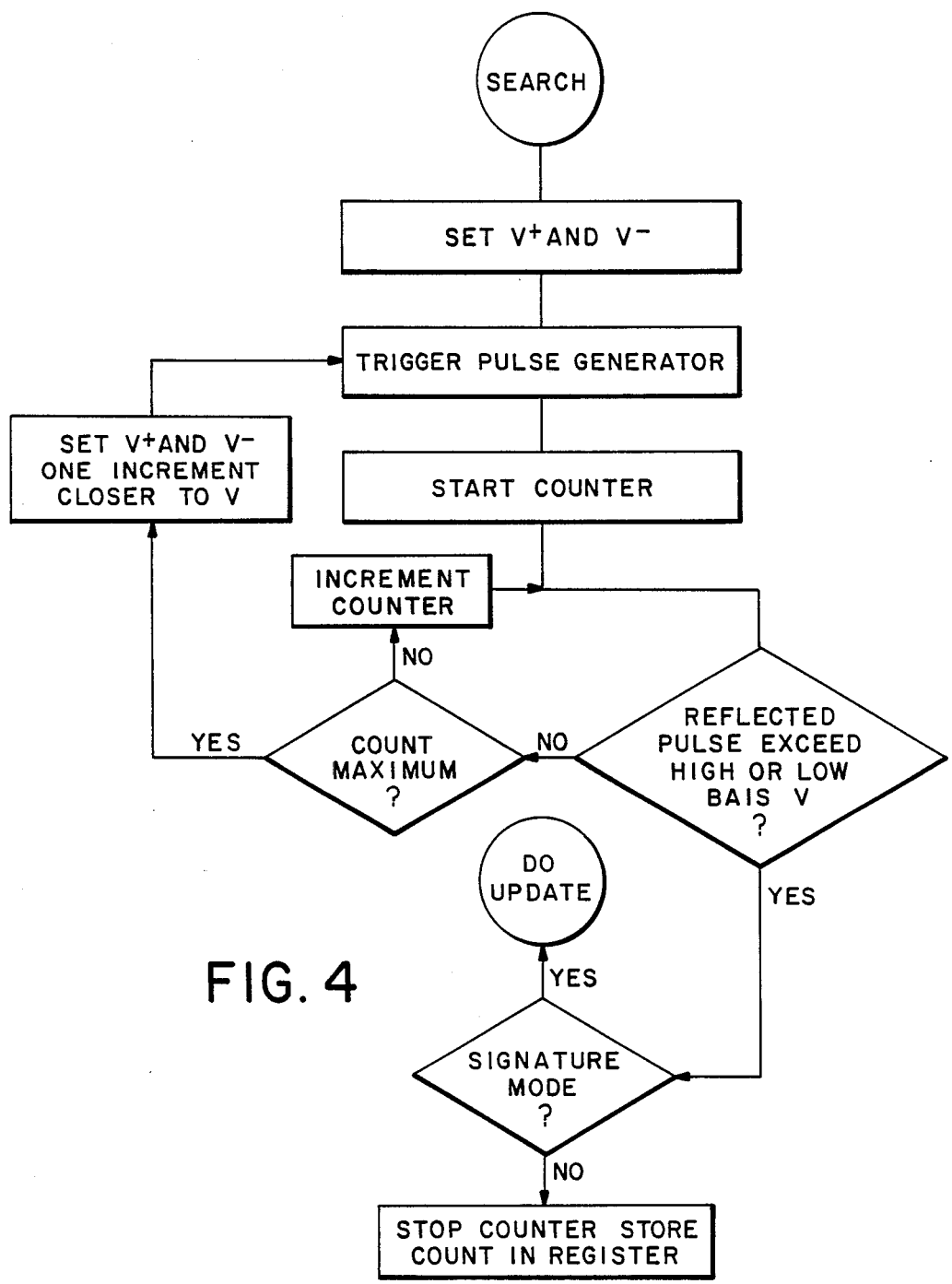
FIG. 4 is a flow chart diagram illustrating the operation of the digital time domain reflectometer of FIG. 2 in a search mode.

For each pulse transmitted by the pulse generator 30, only those reflected voltage pulses which have amplitudes exceeding either the $+V$ or $-V$ bias voltages will be sensed by the control logic 22. A user, however, may wish to test the cable 12 to determine if there are impedance mismatches or discontinuities which are of lesser severity than those which would be sensed by a first set of nominal bias voltages for $+V$ and $-V$. The DTDR 10 may accomplish this type of testing by utilizing a search mode which is illustrated in the flow chart diagram of FIG. 4. In this mode the computer 20 triggers the pulse generator 30 and also starts the counter 42 at the same time the comparators 48 and 50 are enabled by the control logic 22. The counter increments until a reflected pulse is sensed which exceeds either the high or low bias values, $+V$ or $-V$, thus providing a detection signal to the control logic 22 and stopping the counter 42. At the same time, the counter value is provided to the computer via the bus interface logic 24. If the counter 42 reaches a maximum value (which may, for example, represent the time that it would take for a current pulse to travel the entire length of the cable and return) then the counter 42 is stopped and reset to zero. At the same time, the command register 26 commands the bias generator 28 to re-initialize comparators 48 and 50, but this time it alters the values of $+V$ or $-V$ so that both values are closer to the nominal voltage level of the cable 12. At the same time, the pulse generator 30 is triggered by the command register 26. Thus, each time the counter 42 reaches its maximum value the command register 26 sets the bias voltages $+V$ and $-V$ in increments one step closer to the nominal voltage of the cable 12, thus enabling the DTDR 10 to search for impedance mismatches or discontinuities which are increasingly less severe.

Figure 5:
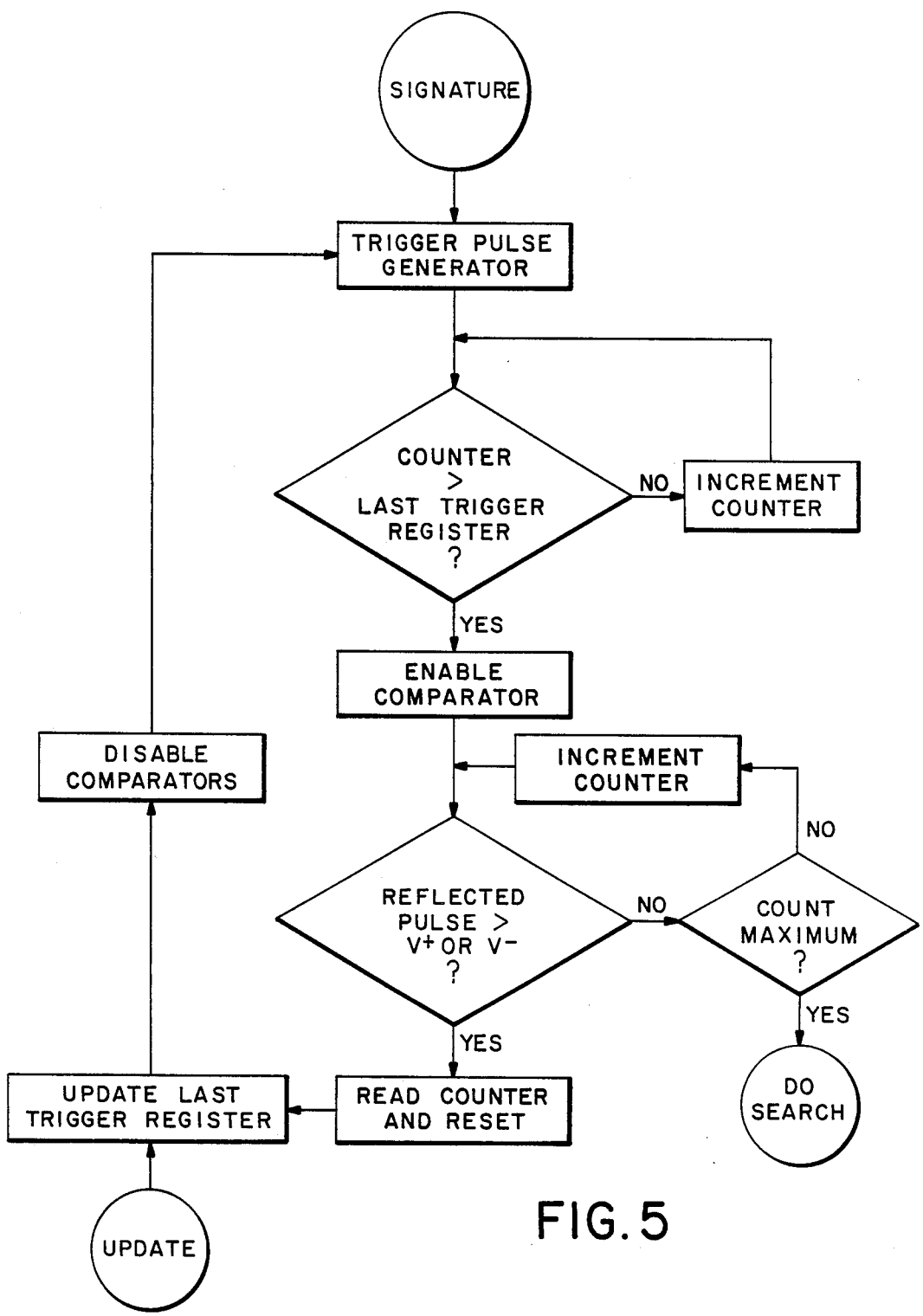
FIG. 5 is a flow chart diagram illustrating the operation of the digital time domain reflectometer of FIG. 2 when used in a mode to obtain the impedance signature of a cable.

In yet another mode of operation, which is described by reference to the flow chart diagram of FIG. 5, the DTDR 10 may determine the unique impedance "signature" of a cable under test 12. In this mode of operation the DTDR 10 finds all impedance mismatches within the cable and records their type and location. This will usually be accomplished by first determining if any major impedance mismatches are present and if not, then the +V and −V bias voltages may be lowered so that minor cable mismatches may be located and characterized. In this mode of operation the pulse generator 30 is triggered and the counter 42 begins to count until its value reaches a value previously taken from the counter 42 and stored in the last trigger register 46. If the count in the last trigger register 46 is zero, as it will be at the initiation of this mode, the comparators 48 and 50 will be enabled immediately. However, if there is a value in the last trigger register 46, the counter 42 will be incremented until the present count exceeds the count in the last trigger register 46 before the comparators 48 and 50 will be enabled. This means that only reflected pulses which indicate impedance mismatches forward along the cable 12 from the last detected impedance mismatch will be obtained. Once the comparator is enabled, it examines reflected pulses and determines if their amplitude exceeds either of the +V or −V bias voltages. If the count in the counter 42 reaches its maximum value without encountering a reflected pulse, the bias values are lowered as they are in the search mode. If a pulse of interest is detected the counter 42 is read and reset, and its value is stored in the last trigger register 46. At this point the comparator is disabled while the pulse generator 30 is retriggered. This loop will repeat until the entire cable has been examined for discontinuities and impedance mismatches within certain ranges of values for the bias voltages of +V and −V. This data may be saved by the computer 20 and used to compare the signature of the cable 12 with that of other cables or with data for the same cable 12 that is obtained at a later time. In this way potential cable problems can be monitored and identified before the entire network becomes inoperative.

Figure 6:
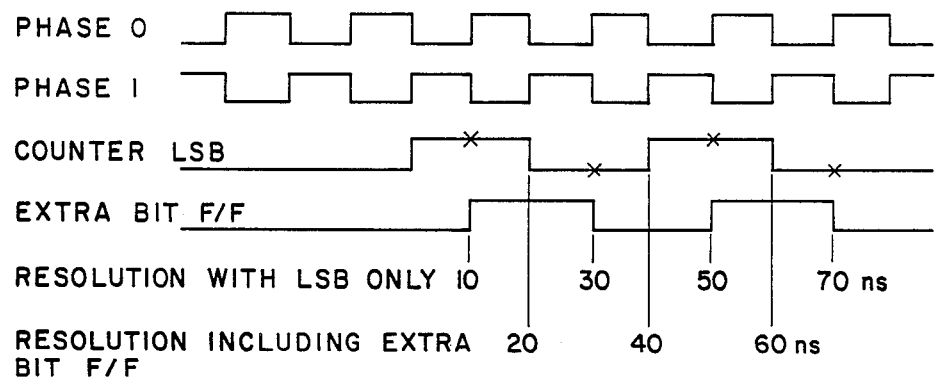
FIG. 6 is a waveform diagram illustrating a method of obtaining enhanced resolution of distance measurements made with the digital time domain reflectometer of FIG. 2.

A major limiting factor of the resolution of a time domain reflectometer which employs a digital clock is the period of the counter. Relatively inexpensive digital counters are available which have a counting rate of 50 megacycles (or a period of 20 ns). Since the velocity of propagation of a signal on a cable of the type used in an IEEE 802.3 network is 0.257 meters per nanosecond, the effective resolution of any device using this counter is 2.57 meters. The resolution of the DTDR 10 may be doubled, however, without increasing the counter rate (which could be done by using a more expensive, higher frequency counter). The oscillator 43 that drives counter 42 has two outputs, "high" and "low," which are approximately 180 degrees out of phase with each other. This relationship is shown in FIG. 6. One output may be used to drive the counter 42 and the other output may be used to drive an extra bit flip-flop 45 which may be also be located in the counter 42. The state of the extra bit flip-flop 45 follows the state of the least significant bit of the counter 42 by 10 nanoseconds. When the comparators detect an impedance mismatch, the control logic 22 stops both the counter 42 and the extra bit flip-flop 45 from changing state. When the computer 20 then reads the status register 44 it may also obtain the state of the extra bit flip-flop. This enables the computer to determine within 10 nanoseconds instead of 20 nonoseconds, the location of the impedance mismatch. The X's in the waveform for the "counter LSB" line show the doubled resolution provided by the change of state of the extra bit flip-flop.

Figure 8:
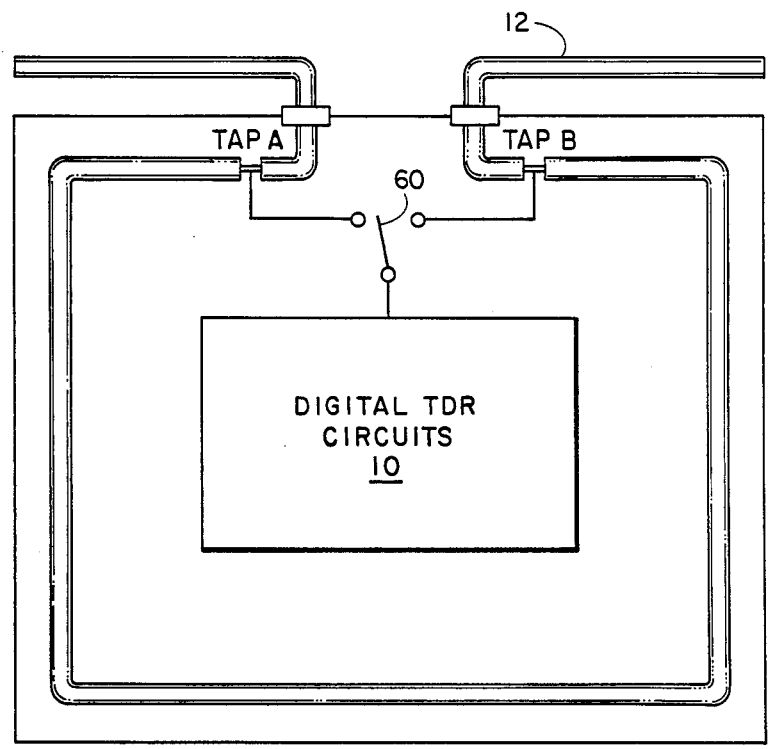
FIG. 8 is a schematic diagram of digital time domain reflectometer connected to a cable under test which may access the cable at one of two taps.

Normally the DTDR 10 would be used at one or the other ends of the cable 12. If, howver, the DTDR is attached to the cable 12 in places other than either end such as in the manner shown in FIG. 1, there is an inherent ambiguity as to which segment of the cable 12 a detected reflection came from. This ambiguity may be resolved in one of two ways as shown with reference to FIGS. 8 and 9. First, the DTDR 10 may be located in the cable 12 in such a way that it is connected to the cable 12 by means of a switch 60 (FIG. 8) which taps into the cable 12 at two different places, tap A or tap B, so that the cable lengths are unequal. Each time a fault or impedance mismatch is detected the switch 60 will automatically connect to the tap of the other segment of the cable and repeat the measurement. Since the distance will be longer in one segment than in the other, the precise location of the impedance mismatch may be determined. The fault location will differ depending on the length of cable, and the shorter distance measurement will indicate the particular segment of cable in which the fault is located.

Figure 9:
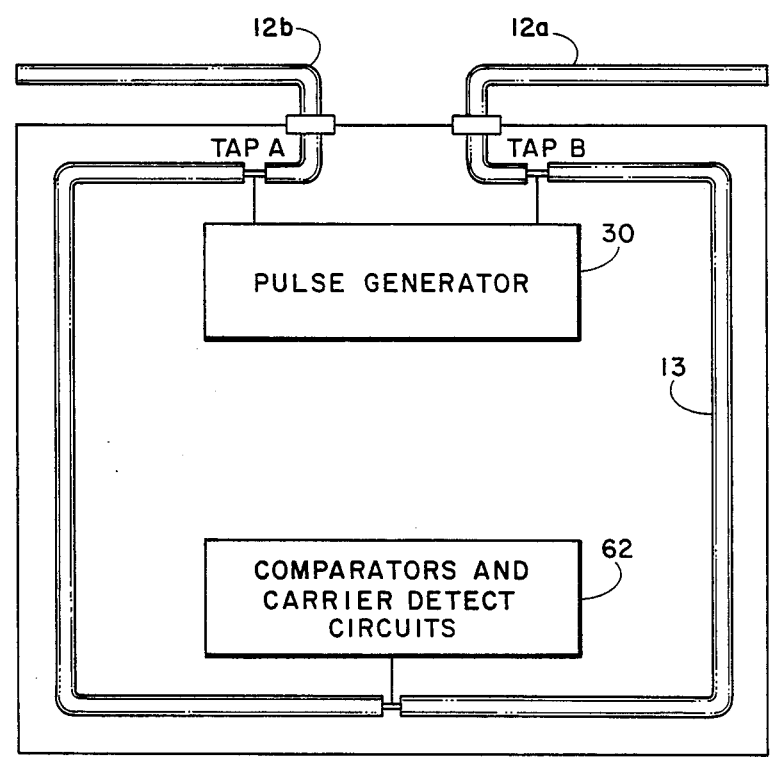
FIG. 9 is a schematic diagram of a digital time domain reflectometer having two pulse generator outputs at taps along the cable at different locations.

An alternative to using a switch is shown in FIG. 9. In this case the pulse generator may be alternately applied to tap A or tap B. It is to be understood that the cable segments 12a and 12b are much longer than the segment 13 connecting either tap A or tap B to the comparators and carrier detect circuits 62. However, the length of the segment 13 connecting tap A and tap B is well within the resolution capability of the system so that alternately applying the test pulse to tap A and tap B will enable the DTDR 10 to determine whether the fault is located in cable segment 12a or in cable segment 12b. All that must be done with this arrangement is to delay slightly the enabling of the comparator to allow the voltage generated by the current generator 30 to reach the middle of the internal cable segment 13 between tap A and tap B. Yet a third possible arrangement would be to generate the test pulse at the center of the segment 13 connecting tap A and tap B and alternately enable the comparators and carrier detect circuits 62 connected to taps A and B.

The DTDR 10 of the embodiment described in FIG. 2 is intended to be used on IEEE 802.3 type networks. However, it could be used on token bus type networks such as an IEEE 802.4. In such a case the control logic circuitry 22 would simply incorporate token passing capabilities by inserting the DTDR 10 into the logical ring formed by the network and would require a token before it would proceed to make measurements. Thus, in this embodiment the carrier detect circuit 36 would be eliminated and substituted in its place would be a line from the control logic circuit 22 indicating acquisition of the token.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A time domain reflectometer connected to a cable under test comprising:
   (a) pulse generator means for generating a test pulse to said cable under test;
   (b) voltage comparator means for comparing a voltage pulse representing a reflection of said test pulse with a predetermined bias value and for providing a detection signal if said voltage pulse exceeds said predetermined bias value;

(c) bias generator means for providing high and low bias levels to said comparator means for establishing said predetermined bias value;

(d) a counter;

(e) register means responsive to said counter for recording the value of said counter; and (f) signal processing means for triggering said pulse generator means and for directing said register means to record the value of said counter means for determining the time elapsed between the generation of said test pulse and the providing of said detection signal, wherein said signal processing means further includes means for resetting said bias generator means to provide altered high and low bias levels when said counter reaches a predetermined maximum count without the occurrence of a voltage pulse which exceeds either the high or low bias value in said voltage comparator means, whereby the location of impedance mismatches along said cable under test may be determined.

2. A method of obtaining an impedance signature of a cable under a test comprising the steps of:

(a) setting high and low bias values in a comparator circuit connected to said cable under test;

(b) triggering a pulse generator for providing a test pulse to the cable under test and simultaneously triggering a counter;

(c) comparing in said comparator circuit the reflected value of the test pulse with said bias values;

(d) recording the time elapsed between the completion of step (b) and the completion of step (c) when the reflected value of the test pulse exceeds at least one of the bias values set in the comparator circuit; and (e) decreasing the high and low bias voltages in the comparator circuit when the counter has reached a predetermined maximum count without the occurrence of a reflected value of the test pulse which exceeds either of said bias voltages.

3. The method of claim 2 further including as step (f), repeating steps (b) through (e).

* * * * *

UNITED STATES PATENT AND TRADEMARK OFFICE
CERTIFICATE OF CORRECTION

PATENT NO. : 4,739,276
DATED : April 19, 1988
INVENTOR(S) : Maris Graube

It is certified that error appears in the above-identified patent and that said Letters Patent is hereby corrected as shown below:

Col. 5, Line 67   Change "imedance" to --impedance--.

Col. 8, Line 2    Change "howver" to --however--.

Signed and Sealed this

Nineteenth Day of September, 1989

Attest:

DONALD J. QUIGG

*Attesting Officer*   *Commissioner of Patents and Trademarks*